United States Patent
Judd et al.

(10) Patent No.: US 11,619,665 B2
(45) Date of Patent: Apr. 4, 2023

(54) ELECTRICAL APPARATUS HAVING TIN WHISKER SENSING AND PREVENTION

(71) Applicant: INTERNATIONAL BUSINESS MACHINES CORPORATION, Armonk, NY (US)

(72) Inventors: Jeffrey N. Judd, Oronoco, MN (US); Matthew Doyle, Chatfield, MN (US); Matthew S. Kelly, Oakville (CA); Henry M. Newshutz, Rochester, MN (US); Timothy J. Tofil, Rochester, MN (US); Mark J. Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 490 days.

(21) Appl. No.: 16/736,192

(22) Filed: Jan. 7, 2020

(65) Prior Publication Data
US 2021/0208190 A1 Jul. 8, 2021

(51) Int. Cl.
*G01R 31/28* (2006.01)
*H05K 3/34* (2006.01)
*H05K 3/30* (2006.01)

(52) U.S. Cl.
CPC ......... *G01R 31/2812* (2013.01); *H05K 3/303* (2013.01); *H05K 3/3421* (2013.01)

(58) Field of Classification Search
CPC ... G01R 31/2812; H05K 3/303; H05K 3/3421
See application file for complete search history.

(56) References Cited

U.S. PATENT DOCUMENTS

| | | | | |
|---|---|---|---|---|
| 3,806,801 A * | 4/1974 | Bove | ............................. | 324/72.5 |
| 4,554,506 A * | 11/1985 | Faure et al. | ............... | 324/158 P |
| 5,225,777 A * | 7/1993 | Brass | .................. | G01R 1/07342 324/756.03 |
| 5,909,124 A * | 6/1999 | Madine | .............. | G01R 1/07328 324/763.01 |
| 6,191,597 B1 * | 2/2001 | Driller | ............... | G01R 1/07335 324/750.25 |
| 6,225,817 B1 * | 5/2001 | Sayre | .................. | G01R 1/07328 324/755.05 |
| 6,885,205 B2 * | 4/2005 | Siew | ................... | G01R 31/2806 324/754.16 |
| 7,262,603 B1 | 8/2007 | Benton et al. | | |

(Continued)

FOREIGN PATENT DOCUMENTS

JP 2016151563 A 8/2016

*Primary Examiner* — Carl J Arbes
(74) *Attorney, Agent, or Firm* — Scott S. Dobson

(57) ABSTRACT

An electrical apparatus that includes: an electronic substrate having a plurality of pads for connecting to an electronic component placed on the electronic substrate; a shield placed on a surface of the electronic substrate, the shield having a plurality of openings with the plurality of openings aligned over the plurality of pads and at least a portion of each of the plurality of openings being conductive; connection means to connect the conductive portions of each of the plurality of openings to a fault detect and error handling circuit; and the fault detect and error handling circuit to detect a short circuit between at least one of the conductive portions and the pad aligned with the opening containing the at least one of the conductive portions.

20 Claims, 15 Drawing Sheets

(56) References Cited

U.S. PATENT DOCUMENTS

| | | | |
|---|---|---|---|
| 7,461,771 B2 * | 12/2008 | Leon | H05K 3/3485 |
| | | | 228/103 |
| 7,839,150 B2 * | 11/2010 | Su | G01R 1/0483 |
| | | | 324/537 |
| 8,055,594 B2 | 11/2011 | Dhanekula et al. | |
| 8,329,248 B2 | 12/2012 | Jackson et al. | |
| 8,866,080 B2 * | 10/2014 | Bower | H01J 37/244 |
| | | | 250/336.1 |
| 8,907,225 B1 | 12/2014 | Deshpande et al. | |
| 9,233,521 B2 | 1/2016 | Chu et al. | |
| 9,948,035 B2 | 4/2018 | Toyama | |
| 2007/0018663 A1 * | 1/2007 | Leinbach | G01R 3/00 |
| | | | 324/763.01 |
| 2007/0187842 A1 | 8/2007 | Shin et al. | |
| 2009/0017327 A1 | 1/2009 | Chen et al. | |

* cited by examiner

ELECTRICAL APPARATUS HAVING TIN WHISKER SENSING AND PREVENTION

BACKGROUND

The present exemplary embodiments pertain to an electrical apparatus having tinned or soldered connections, and more particularly, relate to an apparatus which may be utilized to sense the presence of tin whiskers growing from one or more of the tinned or soldered connections and prevent contact of the tin whiskers with an adjacent tinned or soldered connection.

Whisker growth has been highlighted as a significant hazard and an unknown for high reliability electronic product operation.

Tin whiskers are metallic and are crystalline filamentary structures. They grow outward from metal surfaces and are more commonly found in electrodeposited tin coating, and tin-based alloys. Whiskers can come in many shapes including: filaments, straight, kinked, spiral, nodules, and odd-shaped eruptions.

Lead-free solder joints have resulted in the growth of tin whiskers between components/signals on printed circuit boards leading to unintended conductive paths.

BRIEF SUMMARY

The various advantages and purposes of the exemplary embodiments as described above and hereafter are achieved by providing, according to an aspect of the exemplary embodiments, an electrical apparatus comprising: an electronic substrate having a plurality of pads for connecting to an electronic component placed on the electronic substrate; a shield placed on a surface of the electronic substrate, the shield having a plurality of openings with the plurality of openings aligned over the plurality of pads and at least a portion of each of the plurality of openings being conductive; connection means to connect the conductive portions of each of the plurality of openings to a fault detect and error handling circuit; and the fault detect and error handling circuit to detect a short circuit between at least one of the conductive portions and the pad aligned with the opening containing the at least one of the conductive portions.

According to another aspect of the exemplary embodiments, there is provided an electrical apparatus comprising: an electronic substrate having a plurality of pads for connecting to an electronic component placed on the electronic substrate; the electronic component placed on the electronic substrate, the electronic component having a plurality of conductive leads joined to the plurality of pads on the electronic substrate; a shield placed on a surface of the electronic substrate and covering the electronic component, the shield having a plurality of openings with the plurality of openings aligned over the plurality of conductive leads joined to the plurality of pads such that there is one conductive lead joined to one pad in each of the openings of the shield and at least a portion of each of the plurality of openings being conductive; connection means to connect the conductive portions of each of the plurality of openings to a fault detect and error handling circuit; and the fault detect and error handling circuit to detect a tin whisker from the one of the plurality of conductive leads contained within the one of the openings in contact with the conductive portion in the one of the openings.

According to a further aspect of the exemplary embodiments, there is provided a method of detecting a tin whisker in an electronic apparatus comprising an electronic component having a plurality of soldered conductive leads that are joined to corresponding pads on an electronic substrate, the method comprising: enclosing the soldered conductive leads with a shield placed on a surface of the electronic substrate and covering the electronic component, the shield having a plurality of openings with the plurality of openings aligned over the plurality of conductive leads joined to the plurality of pads such that there is one conductive lead joined to one pad in each of the openings of the shield and at least a portion of each of the plurality of openings being conductive; sensing a tin whisker contacting one of the conductive portions, the contacting causing the generation of an electrical signal; communicating the electrical signal to a fault detect and error handling circuit which indicates the tin whisker contacting one of the conductive portions in the shield; and generating an alert by the fault detect and error handling circuit that a risk of tin whisker growth is present.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

The exemplary embodiments disclose an apparatus and method which mitigates the damage to electrical components due to tin whiskers. Each electrical component that is soldered to the printed circuit board has a corresponding "car-port"-like structure that acts as a shield (or barrier) to limit tin whisker growth and prevent the tin whiskers from physically contacting adjacent tinned or soldered connections.

The exemplary embodiments ensure that if a tin whisker grows from a tinned or soldered connection, the tin whisker cannot short/arc to a nearby tinned or soldered connection within the same device or an adjacent device, or any other conductive feature on the printed circuit board.

The exemplary embodiments further disclose a tin whisker sensor. If a tin whisker grows long enough to come into contact with the shield, a sensing circuit may signal to the operating system that a high risk of tin whisker growth is present and may generate an alert for further action. Such further action may be to call home, initiate system shut down or other action.

Advantages of the exemplary embodiments:
  shield may be added during mechanical attachment operations in parallel with heat sinks, card merge, etc.
  shield is reworkable.
  shield applied to exposed I/O and internal area array I/O devices.
  shield may be added as an extension to a heat sink.
  shield may be added during assembly process, or post processing.
  shield may be applied with or without solder mask application on the printed circuit board.

Figure 1:
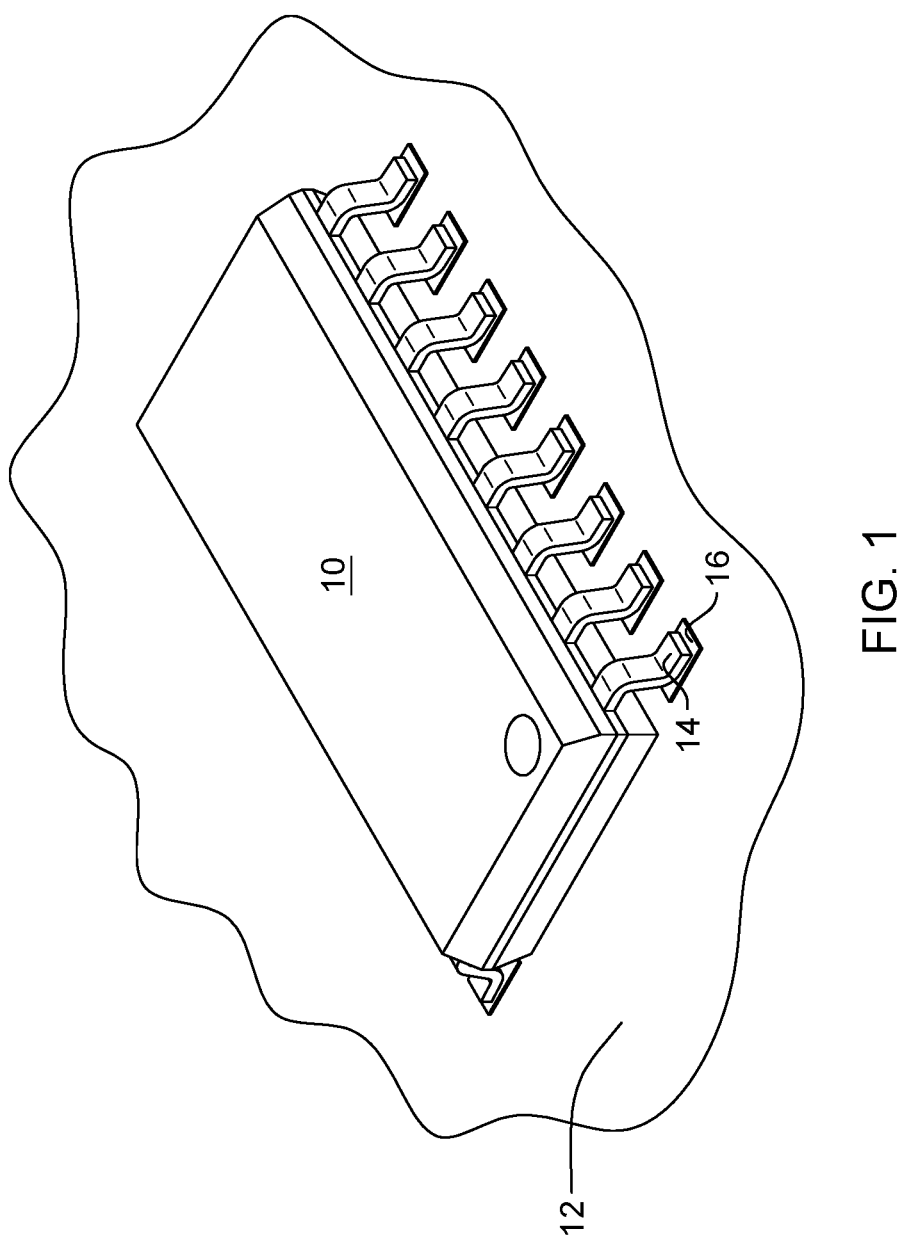
FIG. 1 is a perspective view of a surface mount component mounted on a printed circuit board.

Referring to the Figures in more detail and particularly referring to FIG. 1, there is shown a perspective view of a surface mount component 10 mounted on a printed circuit board 12. The particular surface mount component 10 shown is a Thin Small Outline Package (TSOP) which includes a semiconductor device mounted on a carrier but the exemplary embodiments have wide applicability to other surface mount components such as, but not limited to, Dual In-line package (DIP), Quad Flat Pack package (QFP), Small Outline Package (SOP) and JEDEC package styles.

The surface mount component 10 may have leads 14 which are joined to pads 16 on the surface of the printed circuit board 12 by solder (not shown in FIG. 1). The leads 14 may be copper, for example, and coated with tin for easy solderability to the pads 16. If a tin whisker were to grow from the solder (not shown) or the leads 14 and contact an adjacent lead 14, pad 16 or solder, a short or arc may occur, likely damaging the surface mount component 10.

Figure 2:
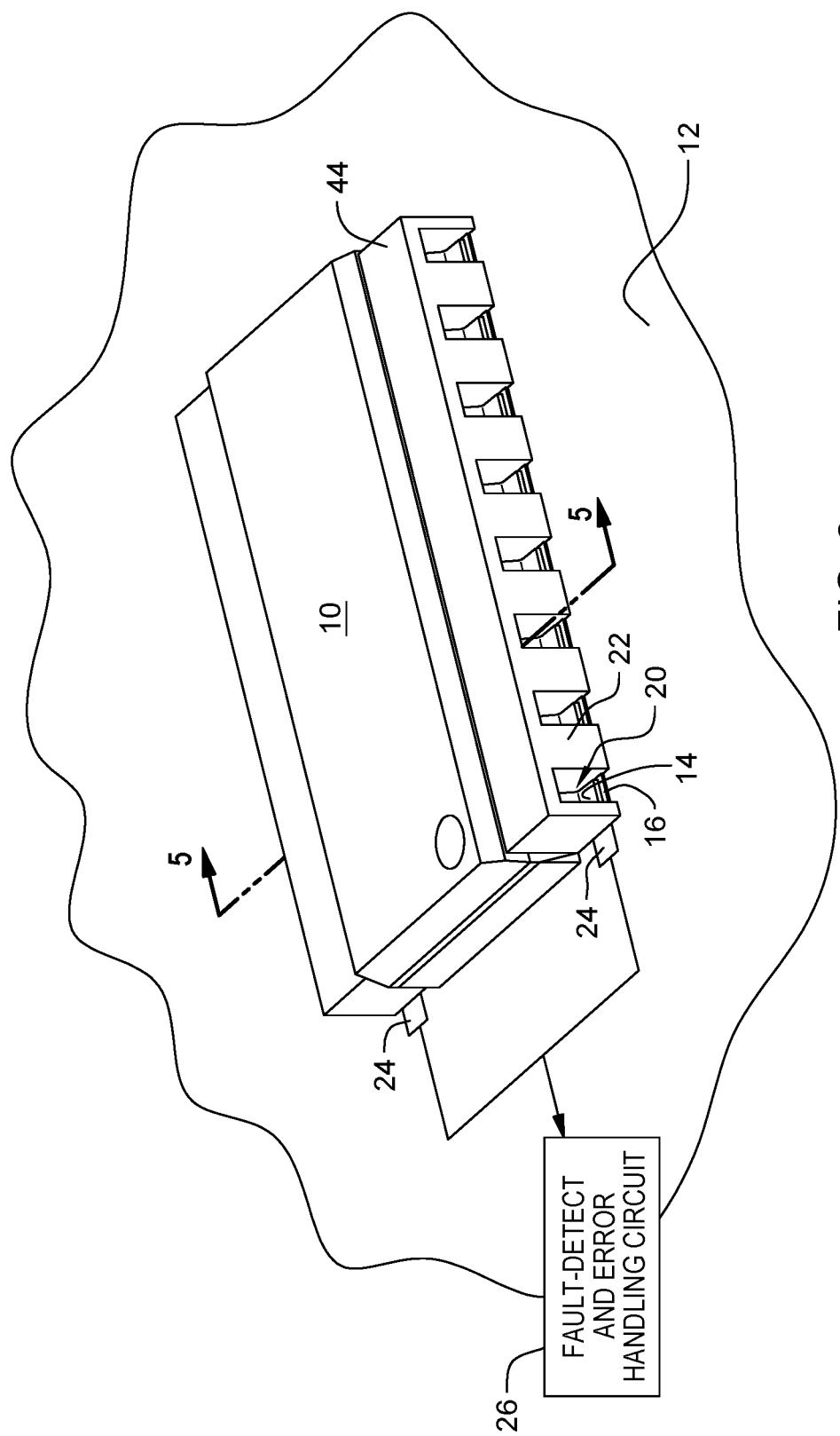
FIG. 2 illustrates a shield placed over the leads of the surface mount component of FIG. 1.

Referring now to FIG. 2, there is illustrated an exemplary embodiment of a shield 44 placed over leads 14 of surface mount component 10 of FIG. 1. The shield 44 has openings 20 through which the leads 14 from the surface mount component 10 and pads 16 on the surface of the printed circuit board 12 are visible. The shield 44 with the openings 20 form the "carport-like" structure of the exemplary embodiments. Preferably the leads 14 and pads 16 do not protrude from the shield 18.

Each of the openings 20 having walls 22 form a barrier between adjacent leads 14, solder (not shown) and pads 16 so if a tin whisker were to form, the adjacent leads 14, solder (not shown) and pads 16 would not be contacted, thereby avoiding the possibilities of shorts and arcs.

The shield 44 may be made from a metallic material such as copper or aluminum for example. An aspect of the exemplary embodiments is to sense when a tin whisker has made contact with a wall 22 of the shield 44. When the shield 144 is fabricated from a metallic material, the entire shield 44 would be conductive and through contact 24, output an indication to a Fault-Detect and Error Handling Circuit 26 when a tin whisker contacts the shield 44.

More preferably, the shield 44 may be made from a nonmetallic material such as an epoxy for example. In this case, to indicate the presence of a tin whisker, the walls 22 of the openings 20 may have to be conductive such as by a metallic coating on the walls 22 and the outer surface of the shield 44 may also be conductive by coating with a metallic material. The metallic coating for the walls 22 and outer surface of the shield 44 may be copper, for example. Then, any tin whisker contact with the walls 22 may be conducted to the metallic outer surface of the shield 44 and then to contact 24 to output an indication to the Fault-Detect and Error Handling Circuit 26 when a tin whisker contacts the shield 44.

Figure 3:
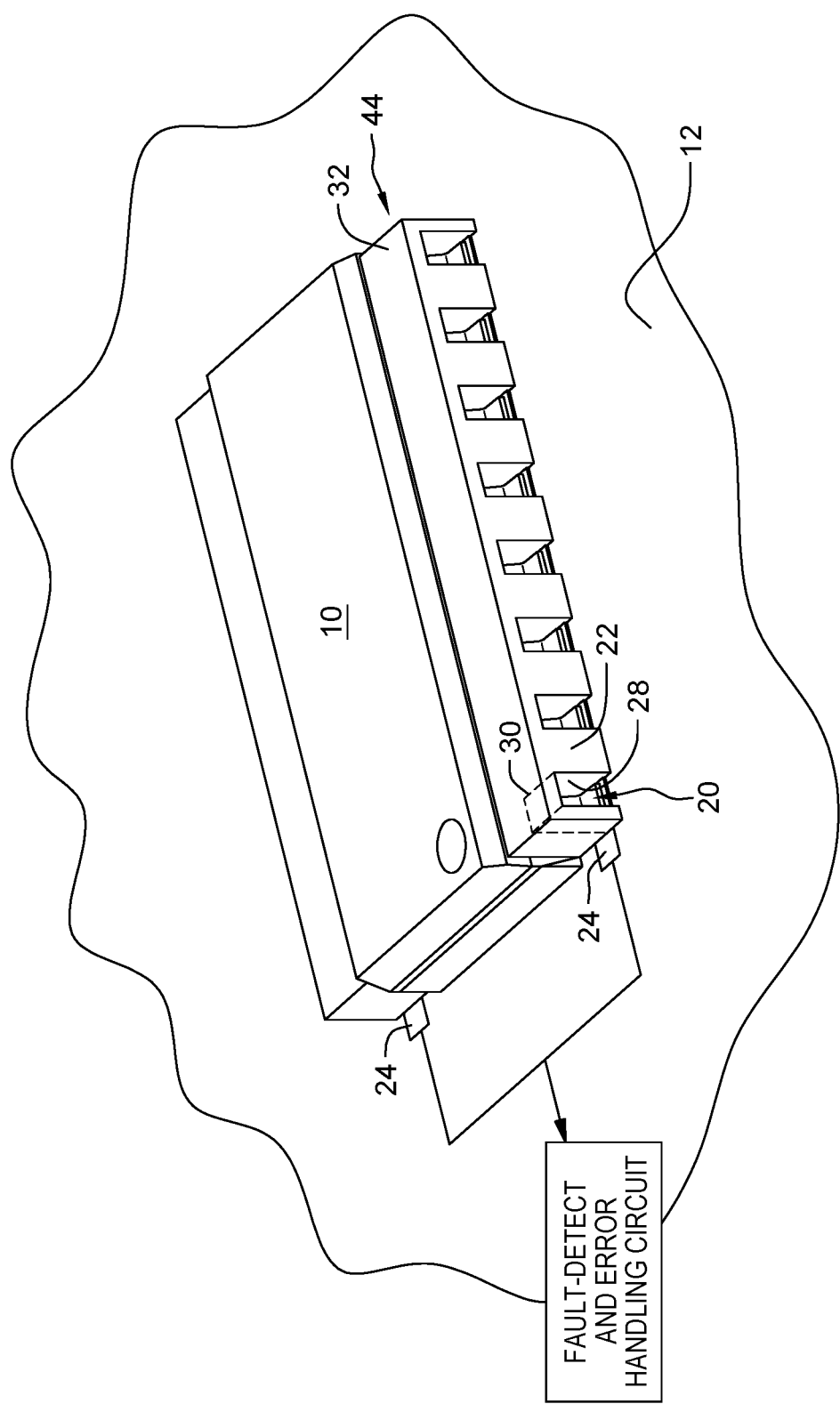
FIG. 3 illustrates an exemplary embodiment in which the shield placed over the leads of the surface mount component of FIG. 1 is nonconductive but has a metallic coating and the interior surface of the walls of the shield also has a metallic coating.

FIG. 3 illustrates an exemplary embodiment in which the shield 44 is nonconductive but has a metallic coating 32 and the interior surface 28 of the walls 22 also has a metallic coating. The shield 44 may have internal wiring 30 such that when a tin whisker contacts interior surface 28 of the walls 22, the contact is conducted through wiring 30 to metallic coating 32 and then to contact 24 for outputting to the Fault-Detect and Error Handling Circuit 26. It should be understood that while internal wiring 30 is shown from only one opening 20, there will be internal wiring 30 to each opening 20 so as to be able to detect tin whiskers in any of the openings 20.

Figure 4:
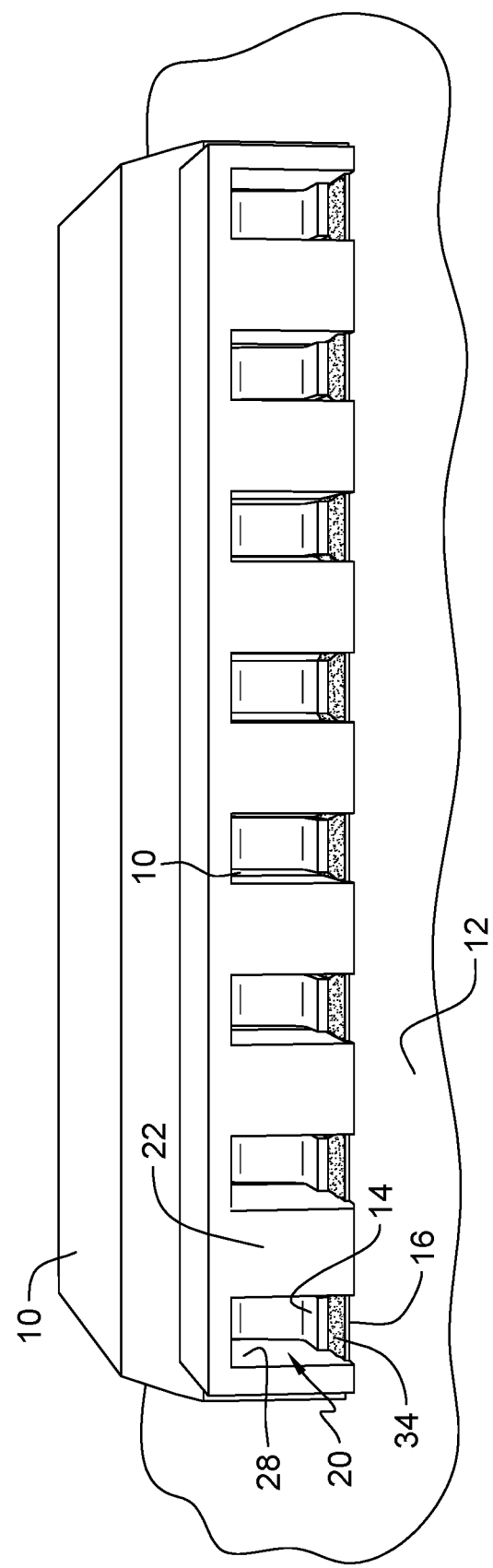
FIG. 4 illustrates a perspective side view of the shield of FIG. 1.

A perspective side view of the shield 44 is illustrated in FIG. 4. Visible in FIG. 4 are the leads 14, pads 16 and solder 34 connecting the lead 14 and pad 16 in each opening 20. Also visible are the interior surface 28 of each wall 22 that is conductive.

Figure 5:
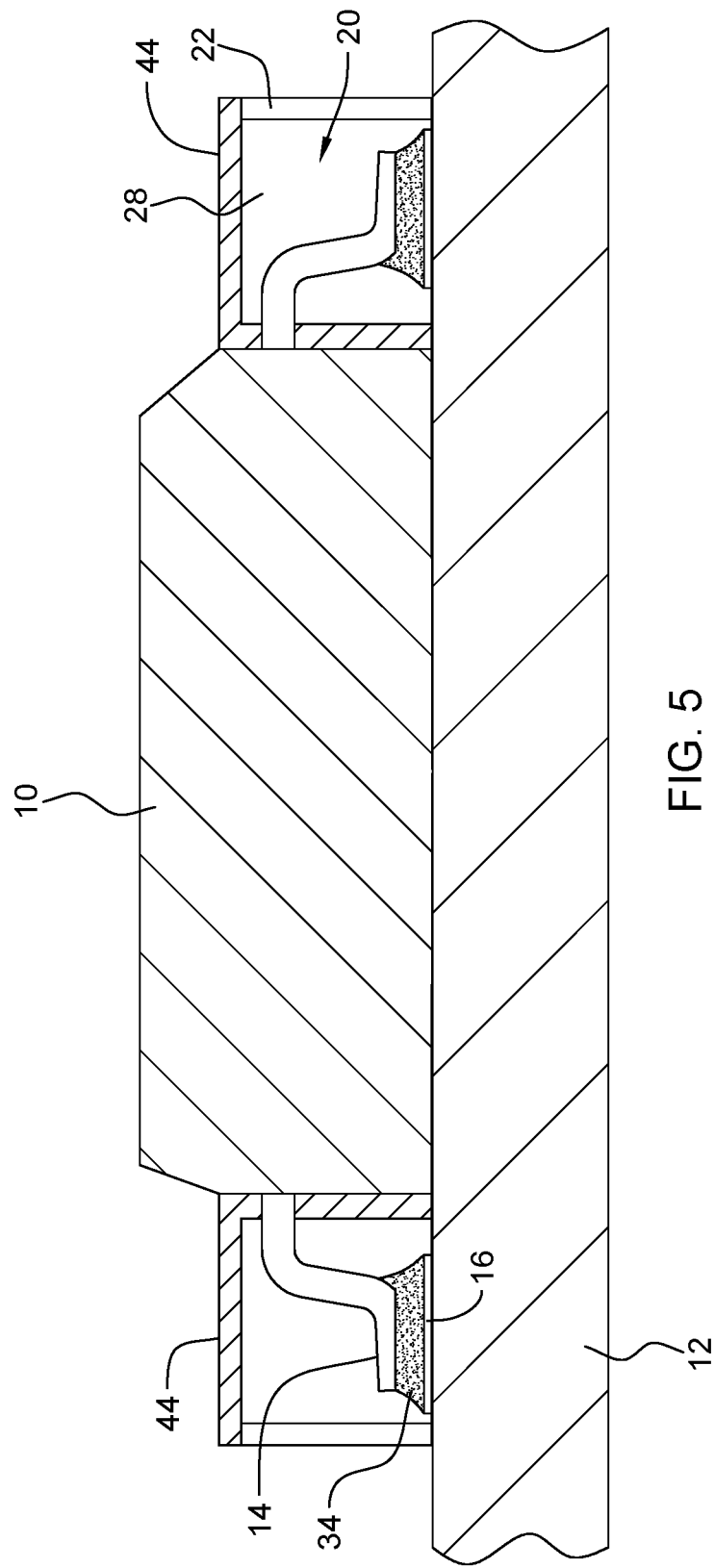
FIG. 5 illustrates a sectional view of the shield of FIG. 1, surface mounted component and printed circuit board in the direction of arrows V-V shown in FIG. 2.

Referring now to FIG. 5, there is illustrated a sectional view of the shield 44, surface mount component 10 and printed circuit board 12 in the direction of arrows V-V shown in FIG. 2. Visible in FIG. 5 are surface mount component 10 mounted on printed circuit board 12. Leads 14 may be connected to pads 16 through solder 34. In the embodiment illustrated in FIG. 5, the shield 44 is metallic so that any contact by a tin whisker with the interior surface 28 of the wall 22 would be conducted through the shield 44 to contact 24 (not shown in FIG. 5) and then to the Fault-Detect and Error Handling Circuit 26 (not shown in FIG. 5).

Figure 6:
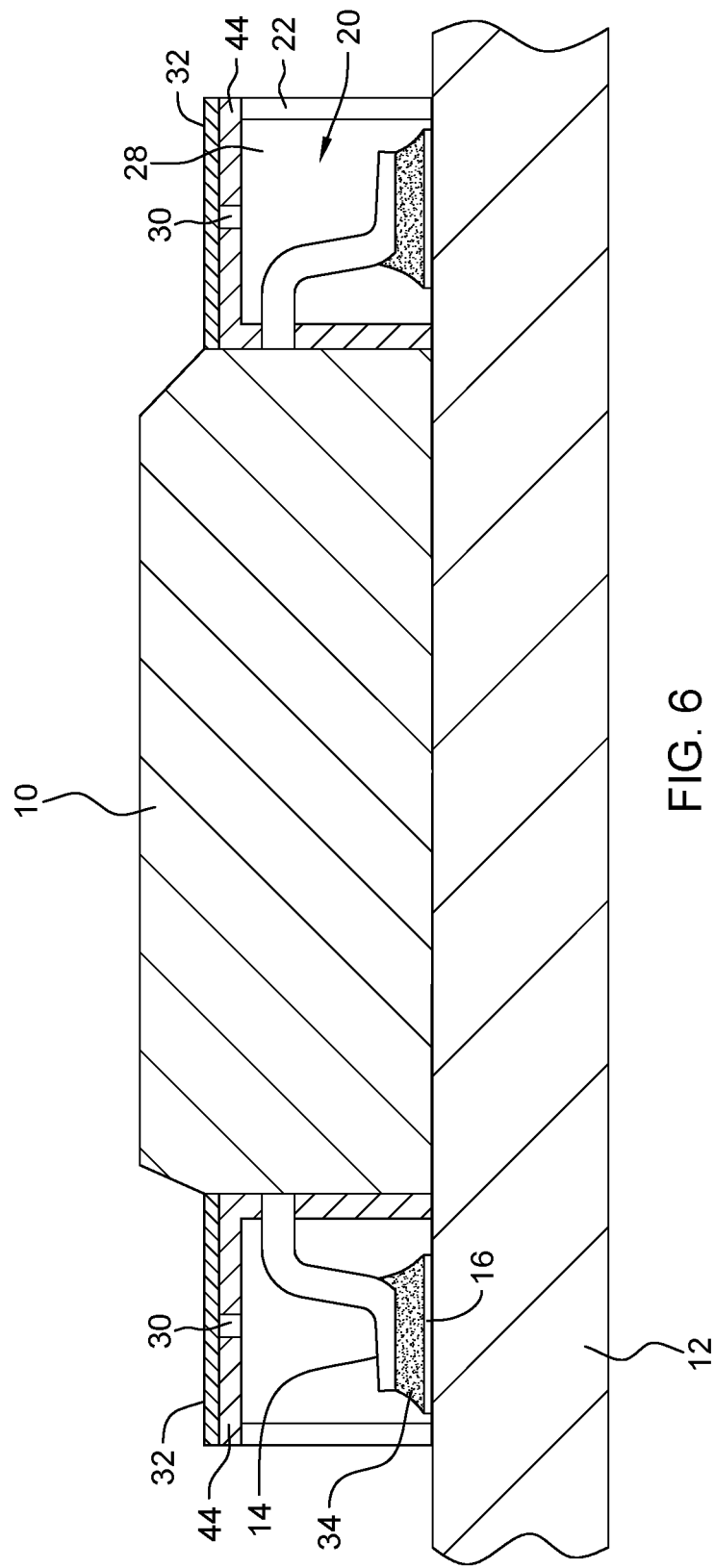
FIG. 6 illustrates a cross sectional view similar to FIG. 5 but in FIG. 6, the shield is nonmetallic and has a metallic coating.

FIG. 6 is a cross sectional view similar to FIG. 5 but in FIG. 6, the shield 44 is nonmetallic and has a metallic coating 32. Then any contact with the interior surface 28 of wall 22, having a metallic coating, would be conducted by wiring 30 to metallic coating 32, to contact 24 (not shown in FIG. 6) and then to the Fault-Detect and Error Handling Circuit 26 (not shown in FIG. 6). There may also be one or more busses (not shown) to join all the wirings 30 from all of the walls 22 which may eventually connect with contact 24 (not shown in FIG. 6) and then to the Fault-Detect and Error Handling Circuit 26 (not shown in FIG. 6).

Figure 7:
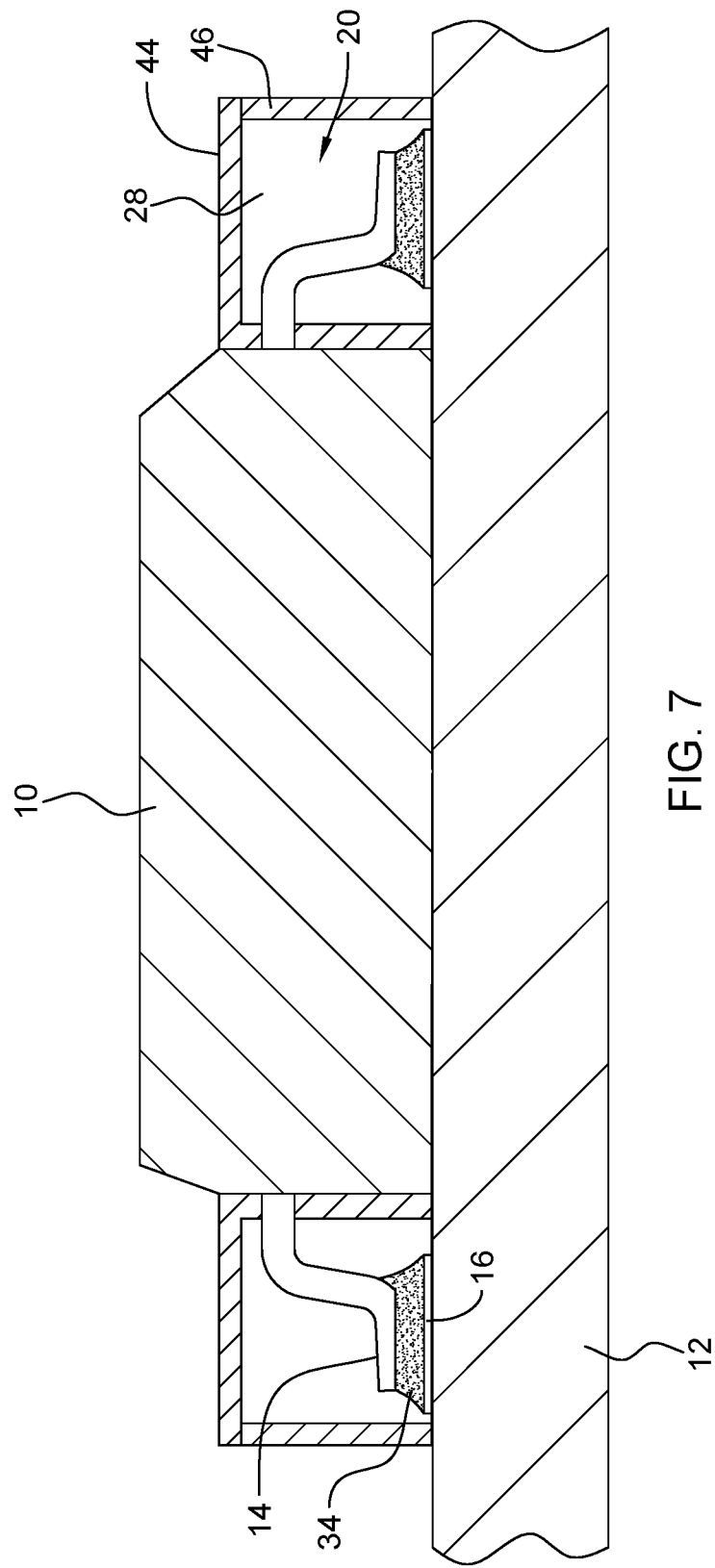
FIG. 7 illustrates a cross sectional view similar to FIG. 5 but in FIG. 7, the openings in the shield that cover the leads of the surface mount component are walled off.

Referring now to FIG. 7, there is illustrated a sectional view of an exemplary embodiment of the shield 44, surface mount component 10 and printed circuit board 12 similar to that shown in FIG. 5 but in the exemplary embodiment shown in FIG. 7, each of the openings 20 may be walled off by a wall 46. In the embodiment illustrated in FIG. 7, the shield 44 is metallic so that any contact by a tin whisker with the interior surface 28 of the wall 22 or wall 46 would be conducted through the shield 44 to contact 24 (not shown in FIG. 5) and then to the Fault-Detect and Error Handling Circuit 26 (not shown in FIG. 5). If the shield 44 is fabricated from a nonmetallic material, the interior of wall 46 may be coated with a metallic coating.

Figure 8:
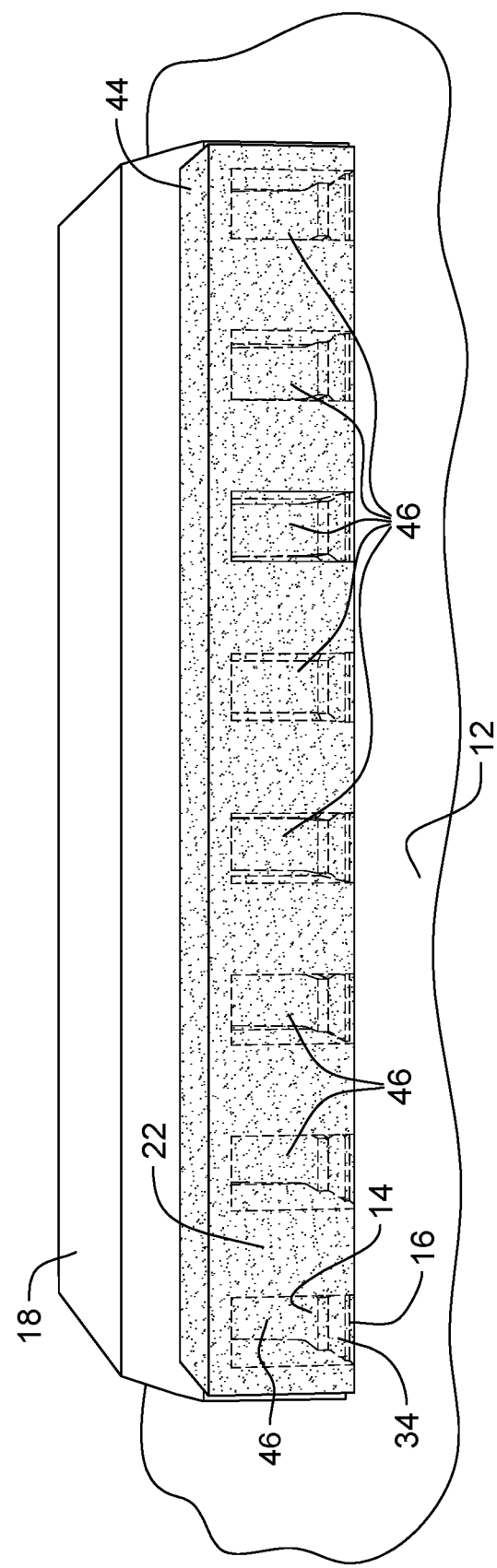
FIG. 8 illustrates a perspective side view of the shield of FIG. 7.

FIG. 8 illustrates a perspective side view of the shield of FIG. 7, particularly showing the walls 46 that wall off the openings 20 of the shield 44.

Figure 9:
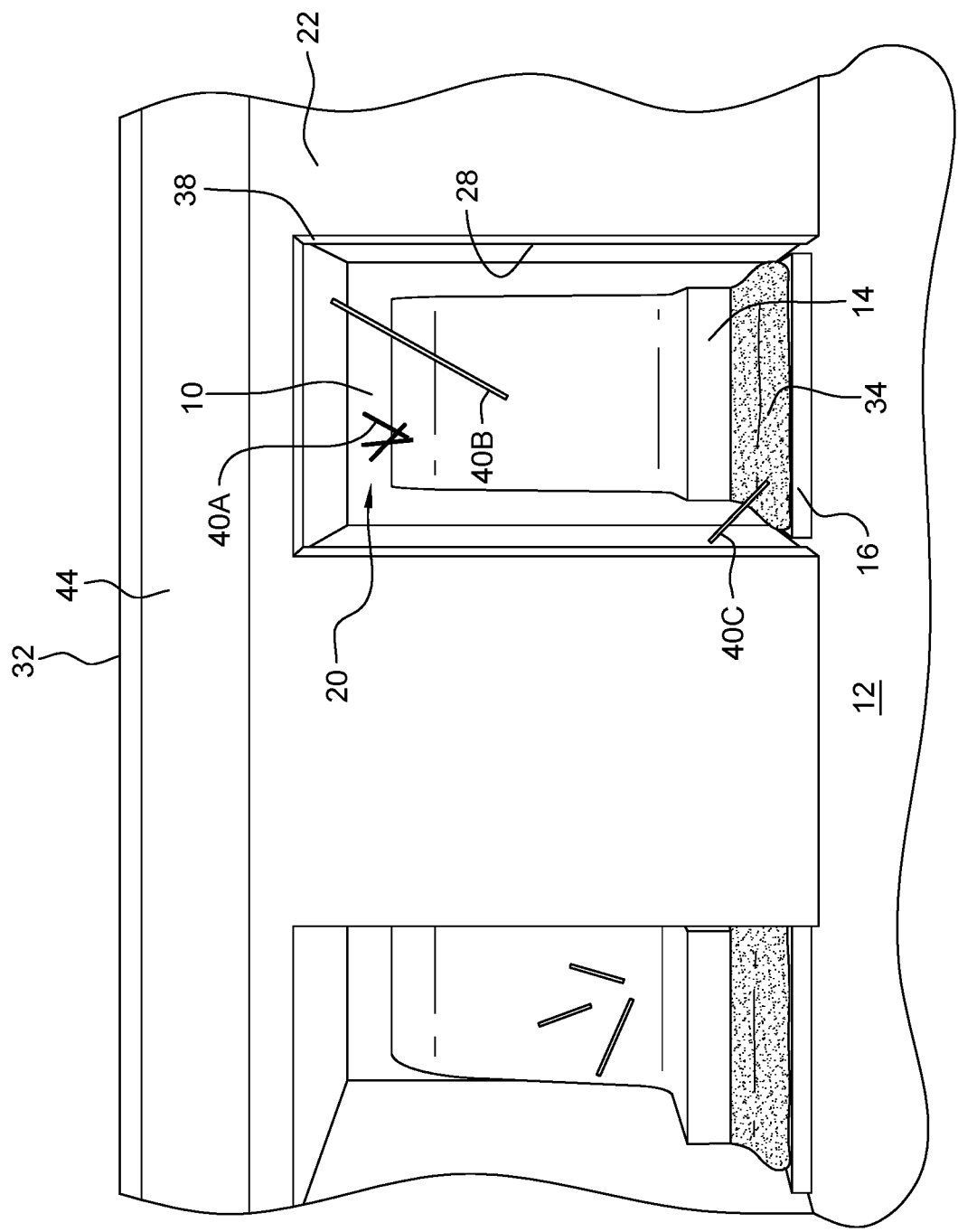
FIG. 9 illustrates tin whiskers, some of which have grown to make contact with the interior surface of the walls of the shield of FIG. 2.

Referring now to FIG. 9, there is illustrated an enlarged perspective side view of the shield 44 on printed circuit board 12. Visible within an opening 20 of the shield 44 is the surface mount component 10 having lead 14 joined to pad 16 by solder 34. In this particular embodiment, the shield 44 is made from a nonmetallic material and has a metallic coating 32. Further, the interior surface 28 of the walls 22 has a metallic coating 38 which is connected to metallic coating 32 as described previously. If in the embodiment of the shield 44 illustrated in FIG. 9 the shield 44 was made from a metallic material, the metallic coating on the shield 44 and the metallic coating 38 on the interior surface 28 of the walls 22 would not be necessary.

Also illustrated in FIG. 9 are tin whiskers 40A, 40B and 40C. Tin whiskers 40B and 40C have grown to make contact with the interior surface 28 of the walls 22. If the walls 22 were not present, the tin whiskers 40B and 40C might have made contact with adjoining leads 14, adjoining pads 16 or adjoining solder 34, possibly shorting out and severely curtailing the utility of the surface mount component 10.

In an exemplary embodiment, the contact of the tin whiskers 40B and 40C with the interior surface 28 of the walls 22 may cause a signal to be propagated to contact 24 and the Fault-Detect and Error Handling Circuit 26 illustrated, for example, in FIG. 2.

Figure 10:
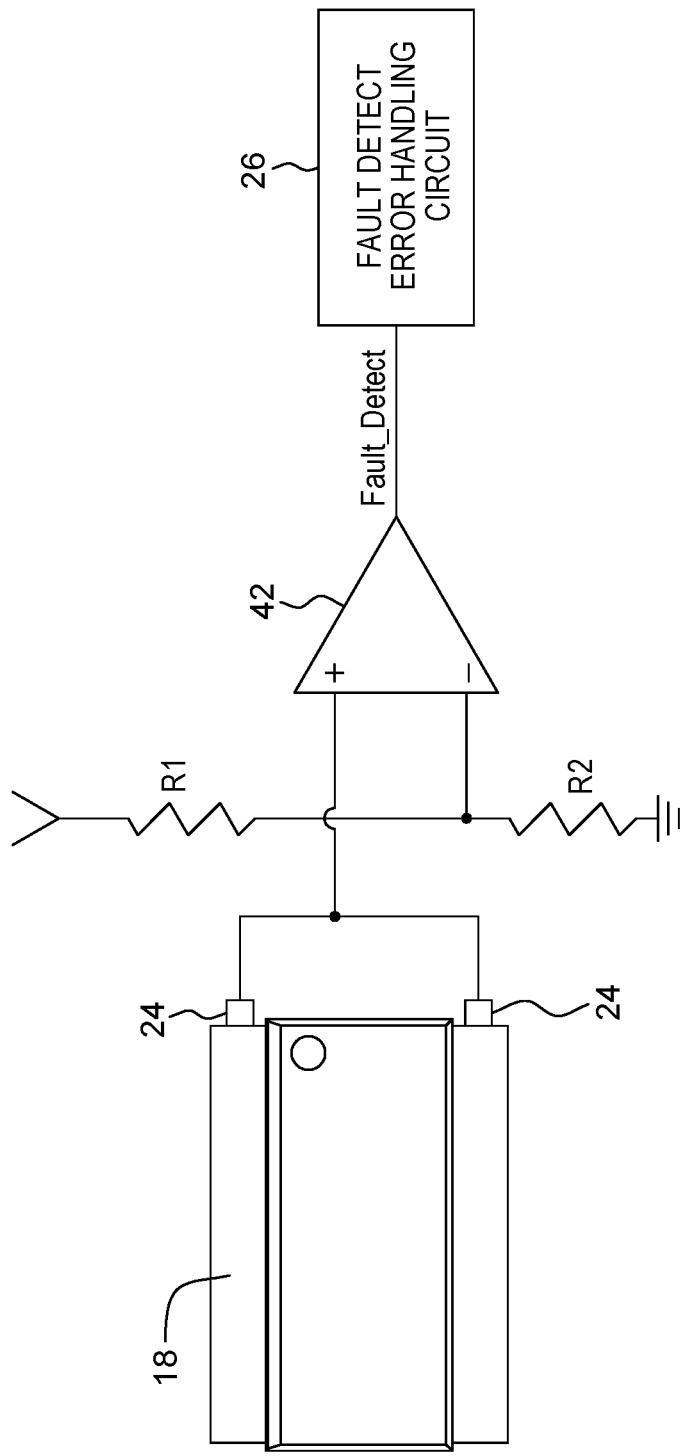
FIG. 10 illustrates the Fault-Detect and Error Handling Circuit 26 in more detail.

The Fault-Detect and Error Handling Circuit 26 is described in more detail in FIG. 10. The shield 44 is electrically integrated into the printed circuit board 12 when the shield 44 is mounted on the printed circuit board 12. When a tin whisker contacts the interior surface 28 of the walls 22, a short is created which outputs through contact 24 a signal to an op amp 42. The op amp 42 digitally outputs a high signal or low signal to the Fault-Detect and Error Handling Circuit 26. The high signal may indicate electrical contact between a tin whisker and the interior surface 28 of the walls 22. If a high signal is generated by the op amp 42, a status register within the Fault-Detect and Error Handling Circuit 26 registers that a tin whisker in one of the openings 20 has made contact with the interior surface 28 of the walls 22. A signal may be sent to the operating system that a high risk of tin whisker growth in a particular shield is present and may generate an alert for further action. Such further action may be to call home, initiate system shut down or other action.

In the exemplary embodiments of the shield 44 illustrated in FIGS. 2 to 8, the shield 44 only covers the leads of the surface mount component 10. The body of the surface mount component 10 itself is not covered by the shield 44.

FIGS. 11 to 15 illustrate exemplary embodiments in which the shield 18 may cover the body of the surface mount component 10 as well as the leads of the surface mount component 10. Except for the fact that the shield 18 covers the body of the surface mount component 10 as well as the leads of the surface mount component 10, the shield 18 operates similarly to shield 44 described previously.

Figure 11:
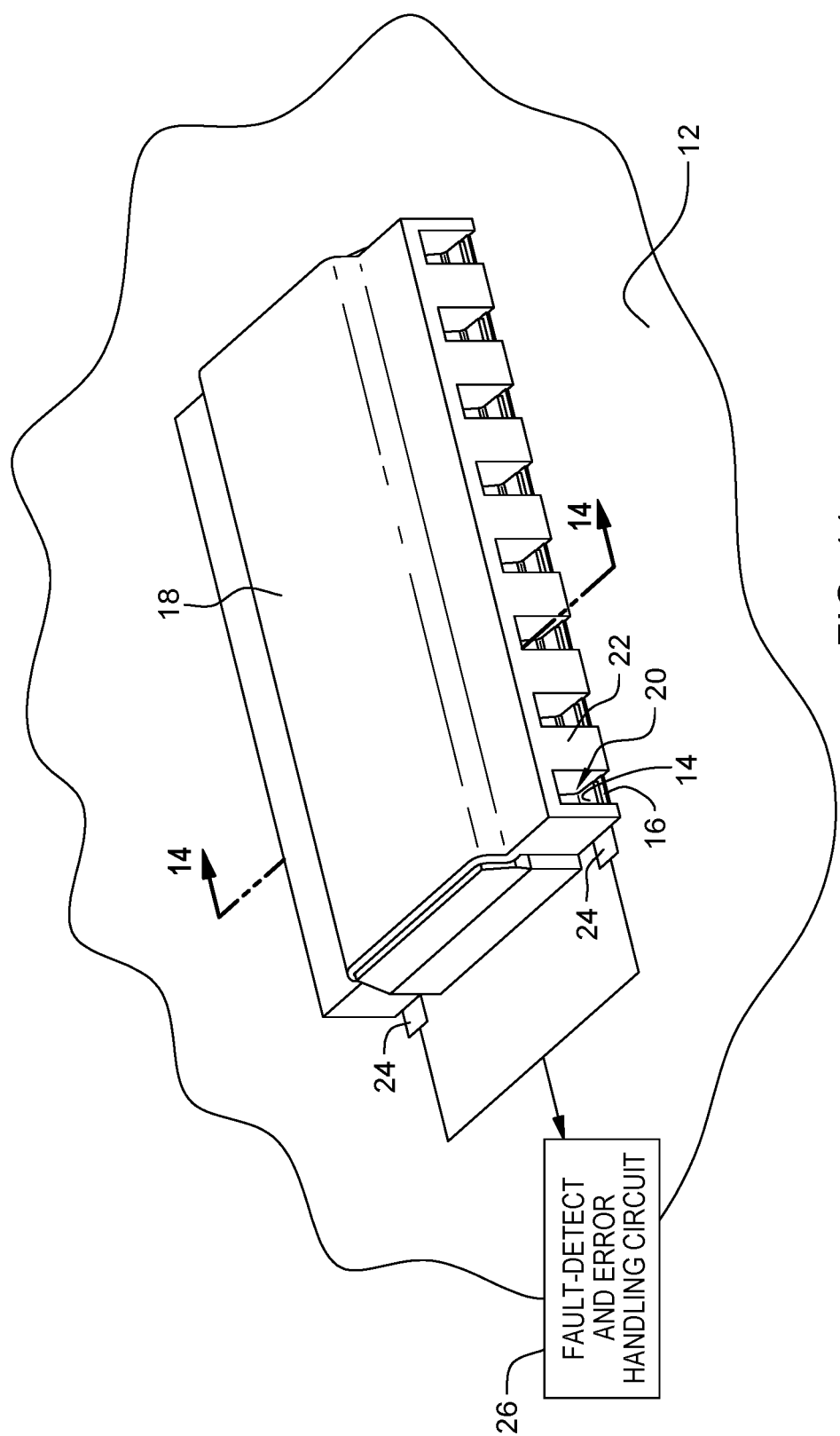
FIG. 11 illustrates an exemplary embodiment of a shield placed over the body and the leads of the surface mount component of FIG. 1.

Referring now to FIG. 11, there is illustrated an exemplary embodiment of a shield 18 placed over leads 14 of surface mount component 10 of FIG. 1. The shield 18 has openings 20 through which the leads 14 from the surface mount component 10 and pads 16 on the surface of the printed circuit board 12 are visible. The shield 18 covering the body and leads of the surface mount component 10 with the openings 20 form the "carport-like" structure of the exemplary embodiments. Preferably the leads 14 and pads 16 do not protrude from the shield 18.

Similar to the previous exemplary embodiments, each of the openings 20 having walls 22 form a barrier between adjacent leads 14, solder (not shown) and pads 16 so if a tin whisker were to form, the adjacent leads 14, solder (not shown) and pads 16 would not be contacted, thereby avoiding the possibilities of shorts and arcs.

Again, the shield 18 may be made from a metallic material or a nonmetallic material as described previously. The shield 18 illustrated in FIG. 11 is fabricated from a metallic material.

Figure 12:
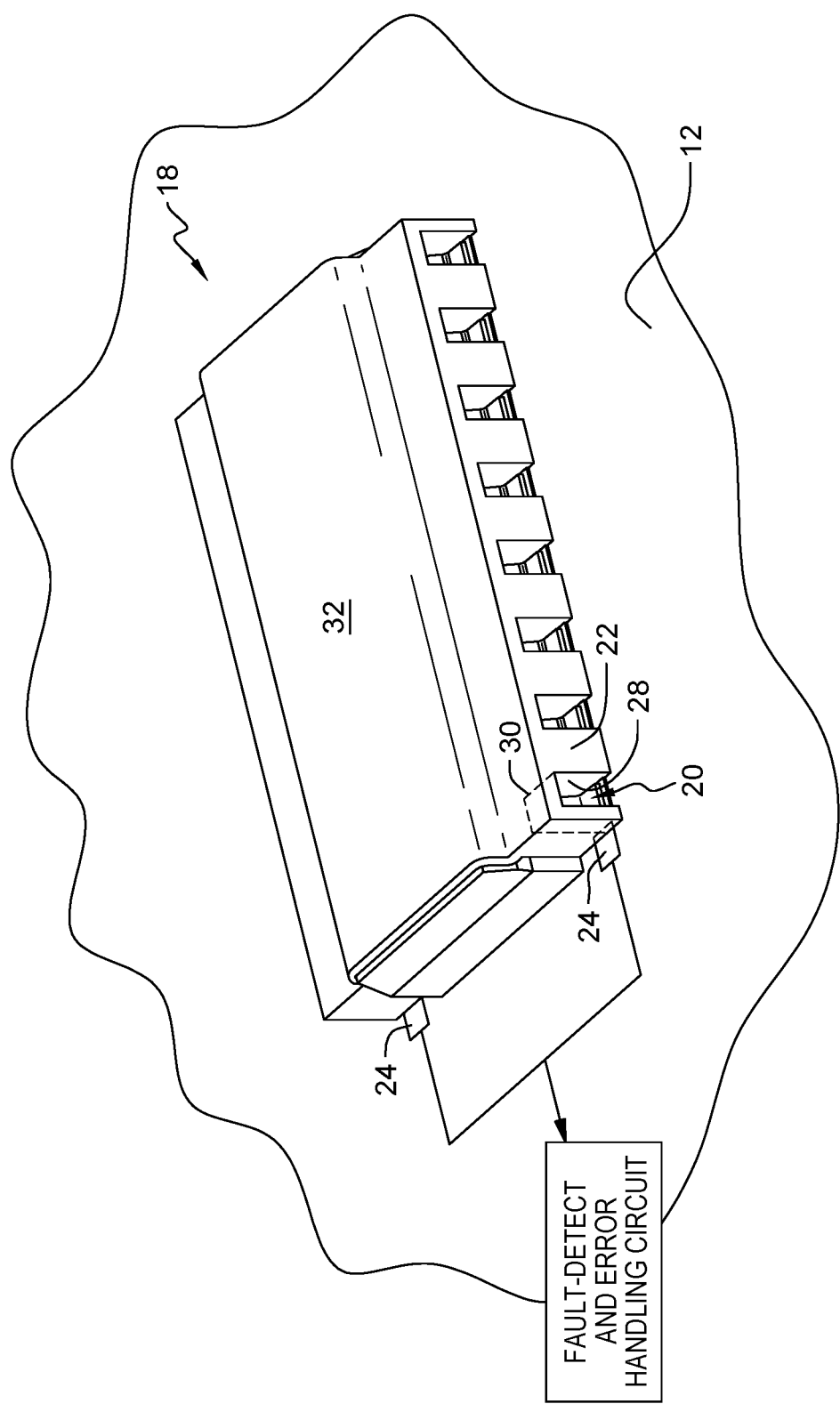
FIG. 12 illustrates an exemplary embodiment in which the shield placed over body and the leads of the surface mount component of FIG. 1 is nonconductive but has a metallic coating and the interior surface of the walls of the shield also has a metallic coating.

FIG. 12 illustrates an exemplary embodiment in which the shield 18 is nonconductive but has a metallic coating 32 and the interior surface 28 of the walls 22 also has a metallic coating.

When a tin whisker has made contact with a wall 22 of the shield 18 illustrated in FIG. 11 or FIG. 12, an indication is outputted to the Fault-Detect and Error Handling Circuit 26.

Figure 13:
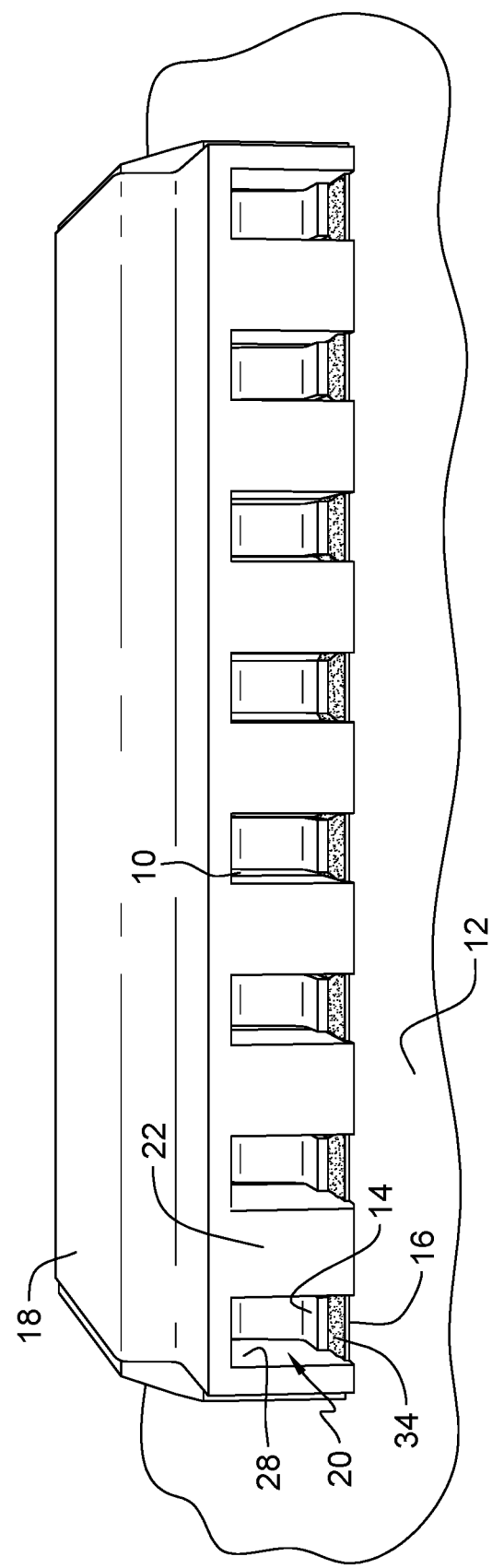
FIG. 13 illustrates a perspective side view of the shield of FIG. 11.

A perspective side view of the shield 18 is illustrated in FIG. 13. Visible in FIG. 13 are the leads 14, pads 16 and solder 34 connecting the lead 14 and pad 16 in each opening 20. Also visible are the interior surface 28 of each wall 22 that is conductive.

Figure 14:
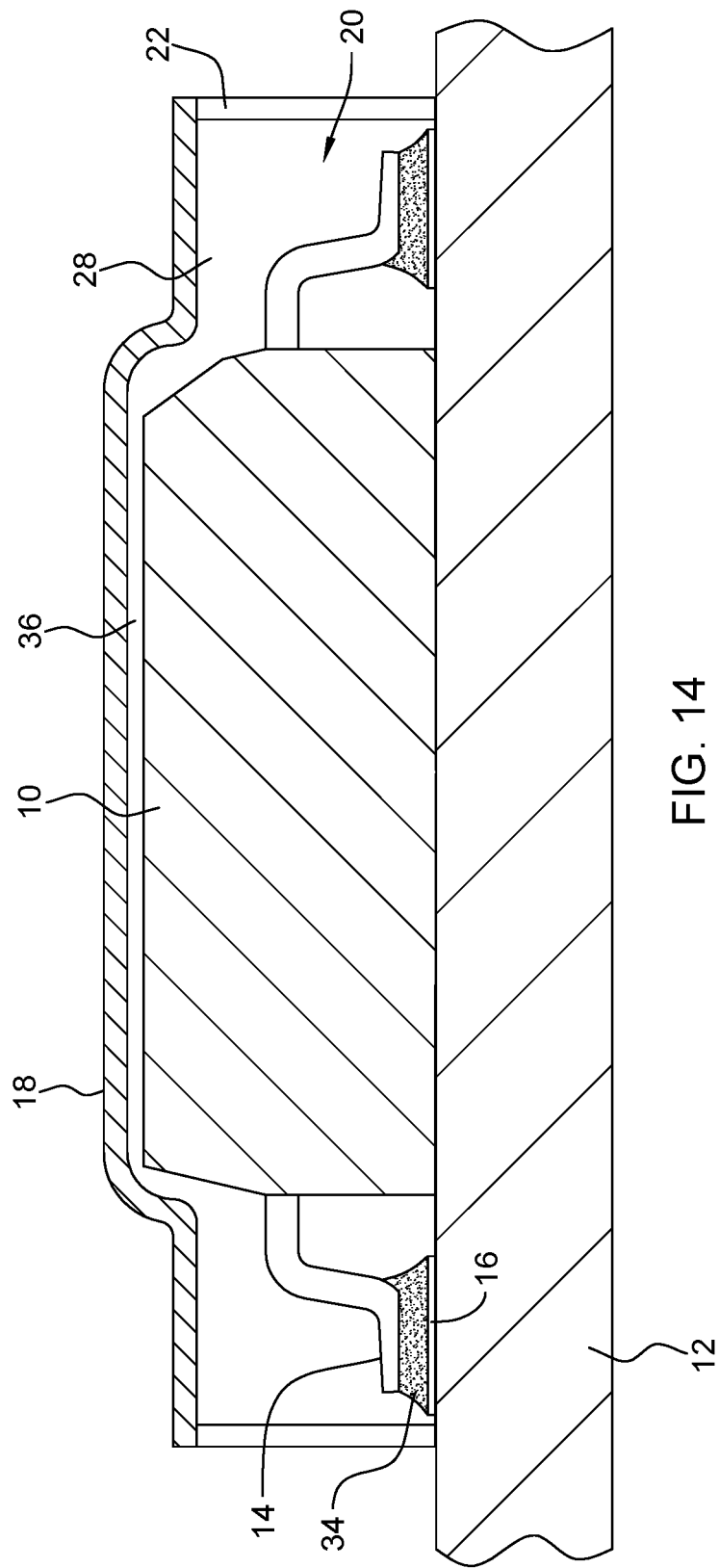
FIG. 14 illustrates a sectional view of the shield of FIG. 11, surface mount component and printed circuit board in the direction of arrows XIV-XIV shown in FIG. 11.

Referring now to FIG. 14, there is illustrated a sectional view of the shield 18, surface mount component 10 and printed circuit board 12 in the direction of arrows XIV-XIV shown in FIG. 11. Visible in FIG. 14 are surface mount component 10 mounted on printed circuit board 12. Leads 14 may be connected to pads 16 through solder 34. There may or may not be a gap 36 between the shield 18 and the surface mount component 10. In the embodiment illustrated in FIG. 14, the shield 18 is metallic so that any contact by a tin whisker with the interior surface 28 of the wall 22 would be conducted through the shield 18 to contact 24 (not shown in FIG. 14) and then to the Fault-Detect and Error Handling Circuit 26 (not shown in FIG. 14).

Figure 15:
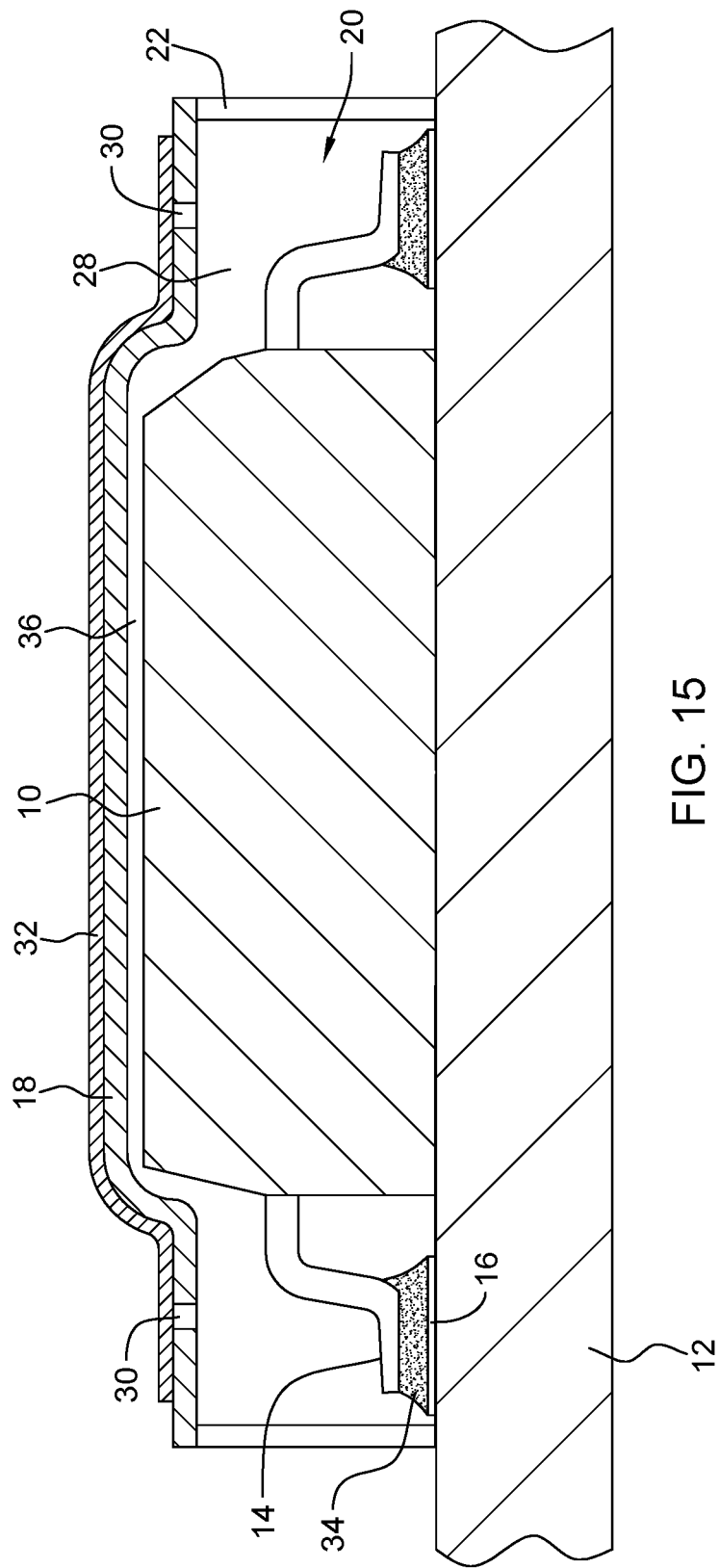
FIG. 15 illustrates a cross sectional view similar to FIG. 14 but in FIG. 15, the shield is nonmetallic and has a metallic coating.

FIG. 15 is a cross sectional view similar to FIG. 14 but in FIG. 15, the shield 18 is nonmetallic and has a metallic coating 32. Then any contact with the interior surface 28 of wall 22, having a metallic coating, would be conducted by wiring 30 to metallic coating 32, to contact 24 (not shown in FIG. 15) and then to the Fault-Detect and Error Handling Circuit 26 (not shown in FIG. 15). There may also be one or more busses (not shown) to join all the wirings 30 from all of the walls 22 which may eventually connect with contact 24 (not shown in FIG. 15) and then to the Fault-Detect and Error Handling Circuit 26 (not shown in FIG. 15).

In another exemplary embodiment, there is disclosed a method of detecting a tin whisker in an electronic apparatus. The electronic apparatus may be that disclosed in FIG. 1 of an electronic component such as a surface mount component 10 having a plurality of soldered conductive leads 14 that are joined to corresponding pads 16 on an electronic substrate.

One step of the exemplary method includes enclosing the soldered conductive leads with a shield placed on a surface of the electronic substrate and covering the electronic component. The shield may be any of the shields 18, 44 previously described. The shield 18, 44 having a plurality of openings 20 with the plurality of openings 20 aligned over the plurality of conductive leads 14 joined to the plurality of pads 16 such that there is one conductive lead 14 joined to one pad 16 in each of the openings 20 of the shield 18, 44 and at least a portion of each of the plurality of openings being conductive.

In another step of the exemplary method, sensing a tin whisker contacting one of the conductive portions of the plurality of openings, the contacting causing the generation of an electrical signal.

In another step of the exemplary method, communicating the electrical signal to a fault detect and error handling circuit 26 which indicates the tin whisker contacting one of the conductive portions in the shield 18, 44.

In a further step of the exemplary method, generating an alert by the fault detect and error handling circuit 26 that a risk of tin whisker growth is present.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An electrical apparatus comprising:
   an electronic substrate having a plurality of pads for connecting to an electronic component placed on the electronic substrate;
   a shield placed on a surface of the electronic substrate, the shield having a plurality of openings with the plurality of openings aligned over the plurality of pads and at least a portion of each of the plurality of openings being conductive, the shield forming a barrier between adjacent pads of the plurality of pads;
   connection means to connect the conductive portions of each of the plurality of openings to a fault detect and error handling circuit; and
   the fault detect and error handling circuit to detect a short circuit between at least one of the conductive portions and the pad aligned with the opening containing the at least one of the conductive portions.

2. The electrical apparatus of claim 1 wherein the shield comprising a body having the plurality of openings, the body being nonconductive and further comprising a metal coating over the body of the shield.

3. The electrical apparatus of claim 2 wherein the connection means comprising conductive wiring between the conductive portions and the metal coating and conductive wiring between the metal coating and the fault detect and error handling circuit.

4. The electrical apparatus of claim 1 wherein the shield comprising a body having the plurality of openings, the body comprising a conductive material.

5. The electrical apparatus of claim 4 wherein the connection means comprising the body and conductive wiring between the body and the fault detect and error handling circuit.

6. The electrical apparatus of claim 1 further comprising an electronic component interposed between the electronic substrate and the shield, the electronic component having conductive leads joining the electronic component to the pads on the electronic substrate and arranged such that there is one conductive lead joined to one pad in each of the openings of the shield.

7. The electrical apparatus of claim 6 wherein the short circuit detected by the fault detection and error handling circuit is a tin whisker from the lead within the opening in contact with the conductive portion in the opening.

8. The electrical apparatus of claim 7 wherein the shield having a wall between each of the openings that acts as a mechanical barrier to the tin whisker making physical contact with an adjacent conductive lead or pad.

9. The electrical apparatus of claim 6 wherein the shield fully covers the electronic component and the conductive leads.

10. An electrical apparatus comprising:
    an electronic substrate having a plurality of pads for connecting to an electronic component placed on the electronic substrate;
    the electronic component placed on the electronic substrate, the electronic component having a plurality of conductive leads joined to the plurality of pads on the electronic substrate;
    a shield placed on a surface of the electronic substrate and covering the electronic component, the shield having a plurality of openings with the plurality of openings aligned over the plurality of conductive leads joined to the plurality of pads such that there is one conductive lead joined to one pad in each of the openings of the shield and at least a portion of each of the plurality of openings being conductive, the shield forming a barrier between adjacent pads of the plurality of pads;
    connection means to connect the conductive portions of each of the plurality of openings to a fault detect and error handling circuit; and
    the fault detect and error handling circuit to detect a tin whisker from the one of the plurality of conductive leads contained within the one of the openings in contact with the conductive portion in the one of the openings.

11. The electrical apparatus of claim 10 wherein the shield comprising a body having the plurality of openings, the body being nonconductive and further comprising a metal coating over the body of the shield.

12. The electrical apparatus of claim 11 wherein the connection means comprising conductive wiring between the conductive portions and the metal coating and conductive wiring between the metal coating and the fault detect and error handling circuit.

13. The electrical apparatus of claim 10 wherein the shield comprising a body having the plurality of openings, the body comprising a conductive material.

14. The electrical apparatus of claim 13 wherein the connection means comprising the body and conductive wiring between the body and the fault detect and error handling circuit.

15. The electrical apparatus of claim 10 wherein the shield having a wall between each of the openings that acts as a mechanical barrier to the tin whisker making physical contact with an adjacent conductive lead or pad.

16. The electrical apparatus of claim 10 wherein the shield fully covers the electronic component and the conductive leads.

17. A method of detecting a tin whisker in an electronic apparatus comprising an electronic component having a plurality of soldered conductive leads that are joined to corresponding pads on an electronic substrate, the method comprising:
    enclosing the soldered conductive leads with a shield placed on a surface of the electronic substrate and covering the electronic component, the shield having a plurality of openings with the plurality of openings aligned over the plurality of conductive leads joined to the plurality of pads such that there is one conductive lead joined to one pad in each of the openings of the shield and at least a portion of each of the plurality of openings being conductive, the shield forming a barrier between adjacent pads of the plurality of pads;

sensing a tin whisker contacting one of the conductive portions, the contacting causing the generation of an electrical signal;

communicating the electrical signal to a fault detect and error handling circuit which indicates the tin whisker contacting one of the conductive portions in the shield; and generating an alert by the fault detect and error handling circuit that a risk of tin whisker growth is present.

18. The method of claim 17 wherein the shield comprising a body having the plurality of openings, the body being nonconductive and further comprising a metal coating over the body of the shield.

19. The method of claim 17 wherein the shield comprising a body having the plurality of openings, the body comprising a conductive material.

20. The method of claim 17 further comprising registering in a computer register the tin whisker contacting one of the conductive portions in the shield.

* * * * *